United States Patent
Yoshikawa et al.

(10) Patent No.: US 9,824,869 B2
(45) Date of Patent: Nov. 21, 2017

(54) ZINC OXIDE SPUTTERING TARGET

(71) Applicant: NGK Insulators, Ltd., Nagoya-Shi (JP)

(72) Inventors: Jun Yoshikawa, Nagoya (JP);
Hirofumi Yamaguchi, Nagoya (JP);
Tsutomu Nanataki, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 257 days.

(21) Appl. No.: 14/848,803

(22) Filed: Sep. 9, 2015

(65) Prior Publication Data

US 2015/0380222 A1    Dec. 31, 2015

Related U.S. Application Data

(63) Continuation of application No. PCT/JP2013/084854, filed on Dec. 26, 2013.

(30) Foreign Application Priority Data

Mar. 25, 2013   (JP) ................................ 2013-061450
Sep. 30, 2013   (JP) ................................ 2013-203489

(51) Int. Cl.
| | |
|---|---|
| *C23C 14/00* | (2006.01) |
| *H01J 37/34* | (2006.01) |
| *C04B 35/453* | (2006.01) |
| *C23C 14/08* | (2006.01) |
| *C23C 14/34* | (2006.01) |

(52) U.S. Cl.
CPC ........ *H01J 37/3429* (2013.01); *C04B 35/453* (2013.01); *C23C 14/086* (2013.01); *C23C 14/3414* (2013.01); *H01J 37/3423* (2013.01); *H01J 37/3426* (2013.01); *C04B 2235/322* (2013.01); *C04B 2235/3222* (2013.01); *C04B 2235/3284* (2013.01); *C04B 2235/5409* (2013.01); *C04B 2235/5445* (2013.01); *C04B 2235/77* (2013.01); *C04B 2235/787* (2013.01); *C04B 2235/85* (2013.01)

(58) Field of Classification Search
CPC .................................................. C23C 14/086
USPC .......... 204/192.11, 192.15, 192.23; 428/702; 313/506; 148/671
See application file for complete search history.

(56) References Cited

U.S. PATENT DOCUMENTS

| | | | | |
|---|---|---|---|---|
| 6,022,458 A | * | 2/2000 | Ichikawa | C30B 23/066 204/192.23 |
| 6,045,634 A | * | 4/2000 | Annavarapu | C23C 14/3414 148/671 |
| 2009/0101493 A1 | * | 4/2009 | Nakayama | C04B 35/453 204/192.11 |
| 2010/0283387 A1 | * | 11/2010 | Lin | H01L 51/5048 313/506 |
| 2010/0300878 A1 | | 12/2010 | Osada et al. | |
| 2011/0284364 A1 | * | 11/2011 | Margadant | B82Y 30/00 204/192.15 |
| 2012/0058366 A1 | * | 3/2012 | Iwahori | C23C 14/086 428/702 |
| 2014/0328747 A1 | | 11/2014 | Yoshikawa et al. | |

FOREIGN PATENT DOCUMENTS

| | | |
|---|---|---|
| EP | 0 486 182 A1 | 5/1992 |
| JP | 06-088218 A1 | 3/1994 |
| JP | 3301755 B2 | 7/2002 |
| JP | 2006-200016 A1 | 8/2006 |
| JP | 3864425 B2 | 12/2006 |
| JP | 2010-070448 A1 | 4/2010 |
| JP | 2010-111560 A1 | 5/2010 |
| JP | 2011-063866 A1 | 3/2011 |
| JP | 2011-179056 A1 | 9/2011 |
| JP | 2013-112833 A1 | 6/2013 |
| WO | 2009/151003 A1 | 12/2009 |
| WO | 2013/114967 | 8/2013 |

OTHER PUBLICATIONS

International Search Report and Written Opinion (Application No. PCT/JP2013/084854) dated Feb. 4, 2014 (with English translation).

\* cited by examiner

*Primary Examiner* — Timon Wanga
(74) *Attorney, Agent, or Firm* — Burr & Brown, PLLC

(57) ABSTRACT

Provided is a zinc oxide-based sputtering target that enables production of a zinc oxide-based sputtered film having higher transparency and electrical conductivity. The zinc oxide-based sputtering target of the present invention is composed of a zinc oxide-based sintered body including zinc oxide crystal grains as a main phase and spinel phases as a dopant-containing grain boundary phase, and the zinc oxide-based sputtering target has a degree of (002) orientation of ZnO of 80% or greater at a sputtering surface, a density of the zinc oxide-based sintered body of 5.50 g/cm$^3$ or greater, the number of the spinel phases per area of 20 counts/100 µm$^2$ or greater, and a spinel phase distribution index of 0.40 or less.

6 Claims, No Drawings

ZINC OXIDE SPUTTERING TARGET

CROSS-REFERENCE TO RELATED APPLICATIONS

This application is a continuation application of PCT/JP2013/084854 filed Dec. 26, 2013, which claims priority to Japanese Patent Application No. 2013-061450 filed Mar. 25, 2013 and Japanese Patent Application No. 2013-203489 filed Sep. 30, 2013, the entire contents all of which are incorporated herein by reference.

BACKGROUND OF THE INVENTION

1. Field of the Invention

The present invention relates to a zinc oxide-based sputtering target.

2. Description of the Related Art

As a transparent conductive film for use in, for example, electronic devices, indium tin oxide (ITO) and the like have been widely used for many years. However, due to price increase of rare metals such as indium, rare-metal alternatives are strongly desired. Accordingly, attempts have been actively made in recent years to use less expensive zinc oxide (ZnO) for producing transparent conductive films, but ZnO is not yet extensively used because there are various problems, for example, the resistance is not sufficiently lowered, and a desired electrical conductivity cannot be obtained. Therefore, a zinc oxide film with higher transparency and electrical conductivity is desired as a transparent conductive material that substitutes for ITO.

It is also known that a highly uniform film can be obtained by sputtering with a sputtering target composed of (002) plane-oriented zinc oxide. For example, Patent Document 1 (JP 33017558) discloses an electrically conductive zinc oxide sintered body having an average sintered grain diameter of 1 µm to 10 µm, a volume resistivity of less than 10 Ω·cm, a density of 4.0 g/cm$^3$ or greater and less than 5.0 g/cm$^3$, and (002) crystal orientation greater than (101) crystal orientation. Patent Document 2 (JP H6-88218A) discloses a zinc oxide-based sintered body having (002) crystal orientation greater than (101) crystal orientation and a density of 4.5 g/cm$^3$ or greater. However, the object of Patent Documents 1 and 2 is to form a low-resistance film or to form a film with a small resistance distribution on a low-temperature substrate, and the resistivity at ordinary substrate temperatures and the transmittance in a near-infrared region of the film are inadequate.

Patent Document 3 (JP 3864425B) discloses a high-density ZnO-based sputtering target in which the maximum diameter of aggregates of the dispersed aluminum component is controlled in order to stably form a film having lower resistance. However, Patent Document 3 is silent on the spinel phase distribution and its influence on the resistivity and the transmittance in a near-infrared region of the film.

Patent Document 4 (JP 2006-200016A), Patent Document 5 (JP 2010-70448A), Patent Document 6 (JP 2010-111560A), and Patent Document 7 (JP 2013-112833A) disclose a ZnO-based sputtering target in which the grain diameter or the distribution of the Al-containing phase is controlled, in order to suppress arcing or improve the moisture resistance of the film. However, the resistivity and the light transmittance in a near-infrared region of the film are inadequate.

Patent Document 8 (JP 2011-63866A) discloses a ZnO-based sputtering target for a film having improved light transmittance in an infrared region and heat resistance by adding Al and Mg and controlling the grain diameter of the Al-containing spinel phase. The grain diameter of the spinel phase is controlled in order to suppress arcing, and the influence on the resistivity and the light transmittance in a near-infrared region of the film is not described.

CITATION LIST

Patent Documents

Patent Document 1: JP 33017558
Patent Document 2: JP H6-88218A
Patent Document 3: JP 3864425B
Patent Document 4: JP 2006-200016A
Patent Document 5: JP 2010-70448A
Patent Document 6: JP 2010-111560A
Patent Document 7: JP 2013-112833A
Patent Document 8: JP 2011-63866A

SUMMARY OF THE INVENTION

The inventors have currently found that a zinc oxide-based sputtered film having higher transparency and electrical conductivity can be produced by sputtering with a zinc oxide-based sputtering target having a) a degree of (002) orientation of ZnO of 80% or greater at a sputtering surface, b) a density of a zinc oxide-based sintered body of 5.50 g/cm$^3$ or greater, c) the number of spinel phases per area of 20 counts/100 µm$^2$ or greater, and d) a spinel phase distribution index of 0.40 or less.

Accordingly, an object of the present invention is to provide a zinc oxide-based sputtering target that enables production of a zinc oxide-based sputtered film having higher transparency and electrical conductivity.

According to an aspect of the present invention, there is provided a zinc oxide-based sputtering target composed of a zinc oxide-based sintered body comprising zinc oxide crystal grains as a main phase and spinel phases as a dopant-containing grain boundary phase, wherein the zinc oxide-based sputtering target has:

a degree of (002) orientation of ZnO of 80% or greater at a sputtering surface,
a density of the zinc oxide-based sintered body of 5.50 g/cm$^3$ or greater,
the number of the spinel phases per area of 20 counts/100 µm$^2$ or greater, and
a spinel phase distribution index of 0.40 or less.

DETAILED DESCRIPTION OF THE INVENTION

Zinc Oxide-Based Sputtering Target

The zinc oxide-based sputtering target according to the present invention is composed of a zinc oxide-based sintered body comprising zinc oxide crystal grains as a main phase and spinel phases as a dopant-containing grain boundary phase. This sputtering target has a) a degree of (002) orientation of ZnO of 80% or greater at a sputtering surface, b) a density of the zinc oxide-based sintered body of 5.50 g/cm$^3$ or greater, c) the number of the spinel phases per area of 20 counts/100 µm$^2$ or greater, and d) a spinel phase distribution index of 0.40 or less. The spinel phase distribution index will be defined below, and a lower distribution index means less variation in the number density of spinel phases and thus greater homogeneity. By performing sputtering film formation using a sputtering target having such a configuration, a zinc oxide-based sputtered film having higher transparency and electrical conductivity can be produced. In particular, this zinc oxide-based sputtered film has significant advantages of low resistance and, at the same time, high light transmittance especially in a near-infrared region. Although the reason for this is not clear, it is considered as follows. That is, with an increased number of spinel phases per area as in c) above and a reduced variation in the number density of spinel phases as in d) above, spinel phases as grain boundary phases are extremely uniformly and finely dispersed in a zinc oxide-based sintered body. Moreover, it is presumed that, with spinel phases being uniformly and finely dispersed as in c) and d) above in an extremely highly oriented and highly dense zinc oxide-based sintered body as in a) and b) above, a homogenous sputtered film having high crystal quality is easily formed by sputtering. In other words, it is presumed that a highly homogenous sputtered film can be formed by dispersing spinel phases as grain boundary phases uniformly and finely in a highly oriented and highly dense zinc oxide-based sintered body, and thus a sputtered film having high electrical conductivity and, at the same time, high transparency (a high light transmittance especially in a near-infrared region) can be produced.

The zinc oxide-based sintered body comprises zinc oxide crystal grains as a main phase and spinel phases as a dopant-containing grain boundary phase. That is, the zinc oxide-based sintered body is mainly composed of zinc oxide crystal grains, typically comprising zinc oxide crystal grains in a proportion of about 70 mass % or greater, more typically 80 mass % or greater, and even more typically 90 mass % or greater, and further comprising spinel phases as a dopant-containing grain boundary phase. The spinel phases as used herein are crystal phases having a spinel structure and typically comprises Zn and a dopant element. Such a dopant element is desirably an element that provides an electrical conductivity improving effect, and dopants such as Al, Ga, and other group 3B elements are preferably exemplified. Therefore, preferable spinel phases are composed of $ZnAl_2O_4$ and/or $ZnGa_2O_4$. In this way, the zinc oxide-based sintered body is a solid in which a countless number of zinc oxide crystal grains together with spinel phases are bonded to each other due to sintering. Zinc oxide crystal grains comprise zinc oxide and may comprise, as another element or impurity, a dopant such as the aforementioned group 3B element, e.g. Al or Ga, or Zr and/or Na which will be described below, and inevitable impurities, or may consist essentially of (or consist of) zinc oxide and inevitable impurities. Such other elements may be substituted at Zn site and O site of the hexagonal wurtzite structure, may be contained as additive elements that do not constitute the crystal structure, or may exist at grain boundaries. Also, the zinc oxide-based sintered body may comprise another heterogeneous phase or another element such as one described above in addition to zinc oxide crystal grains and spinel phases, and the zinc oxide-based sintered body may consist essentially of (or consist of) zinc oxide crystal grains, spinel phases, and inevitable impurities.

As described above, the zinc oxide-based sintered body may comprise a small amount of Zr and/or Na as an impurity. Although such an impurity may not be preferable in semiconductor or like applications, such an impurity is not particularly problematic in CIGS solar cells or the like. Although the mechanism is unclear, a small amount of Zr and/or Na can rather contribute to reducing arcing and improving the film formation rate. It is presumed that both elements have the effect of enhancing grain boundary strength and preventing falling-off of grains from the target surface. For example, the zinc oxide-based sintered body may comprise preferably no less than 100 ppm of Zr, more preferably 100 to 2000 ppm, and even more preferably 200 to 1000 ppm. Moreover, the zinc oxide-based sintered body may comprise preferably no less than 10 ppm of Na, more preferably 15 to 100 ppm, and even more preferably 20 to 80 ppm.

The zinc oxide-based sintered body of the present invention has a degree of (002) orientation of 80% or greater at the sputtering surface, preferably 85% or greater, and more preferably 90% or greater. Since the (002) plane is considered to be a crystal plane that is easily sputtered, the higher the degree of (002) orientation is, the more increased the film formation rate can be while suppressing arcing. In particular, an extremely high degree of (002) orientation of 80% or greater presumably results in homogeneous sputtering and is a prerequisite for enabling the improvement of transparency and electrical conductivity by uniformly and finely dispersing spinel phases. Therefore, the upper limit of the degree of (002) orientation at the sputtering surface should not be particularly limited, and is ideally 100%. This degree of orientation of the (002) plane was determined by measuring an XRD profile through irradiating the surface of a disc-like zinc oxide-based sintered body with X rays using an XRD apparatus (manufactured by Rigaku Corporation, trade name "RINT-TTR III"). The degree of (002) orientation is calculated according to the following formulae.

$$\text{Degree of (002) orientation [\%]} = \frac{p - p_0}{1 - p_0} \times 100 \qquad \text{[Formula 1]}$$

$$p_0 = \frac{I_0(002)}{I_0(100) + I_0(002) + I_0(101)}$$

$$p = \frac{I_s(002)}{I_s(100) + I_s(002) + I_s(101)}$$

where $I_0(hkl)$ and $I_s(hkl)$ are diffraction intensities (integral values) of the (hkl) planes in ICDD No. 361451 and a sample, respectively The zinc oxide-based sintered body has a density of 5.50 $g/cm^3$ or greater, preferably 5.52 $g/cm^3$ or greater, and more preferably 5.55 $g/cm^3$ or greater. Such a high density makes it easy to simultaneously achieve suppression of arcing and improvement of film formation rate during sputtering. In particular, an extremely high density of 5.50 $g/cm^3$ or greater is a prerequisite for enabling the improvement of transparency and electrical conductivity by uniformly and finely dispersing spinel phases.

The zinc oxide-based sintered body has the number of spinel phases per area of 20 counts/100 $\mu m^2$ or greater, preferably 30 counts/100 $\mu m^2$ or greater, more preferably 40 counts/100 $\mu m^2$ or greater, and even more preferably 50 counts/100 $\mu m^2$ or greater. Moreover, the zinc oxide-based sintered body has a spinel phase distribution index of 0.40 or less, preferably 0.30 or less, more preferably 0.20 or less, and even more preferably 0.15 or less. The number of spinel phases per area and the spinel phase distribution can be measured as follows. A test piece is cut out from the vicinity of the center of a plate-like sintered body, and a surface perpendicular to the plate surface is polished. Near the central part of the test piece in the thickness direction, a backscattered electron image is obtained over a scanning electron microscopic visual field of 20 $\mu m \times 20$ $\mu m$, and the number of phases that have a contrast different from the ZnO matrix is counted in each of the four 10 $\mu m \times 10$ $\mu m$ visual fields obtained by dividing the backscattered electron image into four equal parts in a lattice-like manner. Whether the phase differing in contrast from ZnO is a spinel phase or not is verified by a crystal phase analysis by XRD and a compositional analysis by EDS. The average value of the four visual fields is regarded as the number of the spinel phases per area [count/100 µm$^2$] in the sample. Moreover, the value obtained by dividing the standard deviation of the number of the spinel phases of the four visual fields by the aforementioned average value of the four visual fields is defined as a spinel phase distribution index. That is, a lower distribution index means less variation in the number density of the spinel phases and thus greater homogeneity. Presumably, a higher number of the spinel phases per area and a lower spinel phase distribution index brings about a more remarkable effect of homogeneous sputtering with a target having a high degree of (002) orientation, and thus a sputtered film having higher transparency and electrical conductivity is more likely to be obtained. Therefore, the upper limit of the number of the spinel phases per area should not be particularly limited, and it is typically 100/100 µm$^2$ or less. Similarly, the lower limit of the spinel phase distribution index should not be particularly limited, and it is typically 0.05 or greater.

The zinc oxide-based sintered body preferably has the number of pores per area of 1500/mm$^2$ or greater, more preferably 1700/mm$^2$ or greater, and even more preferably 1800/mm$^2$ or greater. By increasing the number of pores per area in this way, a film having even lower resistance can be produced. Although the reason for this is not clear, it is presumed that fine pores existing in a dispersed state bring about a more remarkable effect of homogeneous sputtering with a target having a high degree of (002) orientation, and thus a sputtered film having higher transparency and electrical conductivity is more likely to be obtained. Although the upper limit of the number of pores per area of the zinc oxide-based sintered body should not be particularly limited, it is typically 3000/mm$^2$ or less and more typically 2000/mm$^2$ or less. The average pore diameter is preferably 1 µm or less.

Production Method

The zinc oxide-based sputtering target according to the present invention may be produced by any method as long as desired properties are obtained. The oriented sintered body can be prepared by, for example, a method according to which a strong magnetic field is applied to a slurry and firing the resulting oriented green body. As a more preferable method, the oriented sintered body can be prepared also by preparing a plate-like zinc oxide powder, applying shearing force to this plate-like zinc oxide powder to form an oriented green body, and firing this oriented green body. This preferable production method will now be described below.

(1) Preparation of Plate-Like Zinc Oxide Powder

First, plate-like zinc oxide precursor particles are produced by a solution method using a zinc ion-containing raw material solution. Examples of zinc ion sources include zinc sulfate, zinc nitrate, zinc chloride, organic acid salts such as zinc acetate, zinc alkoxides, and the like. Zinc sulfate is preferable because it can also supply sulfate ions, which will be described below. A production technique for plate-like zinc oxide precursor particles by a solution method is not particularly limited, and production can be performed according to a known technique.

It is preferable that the raw material solution comprises a water-soluble organic material and sulfate ions because a porous material having a large specific surface area can be obtained. Examples of the water-soluble organic material include alcohols, polyols, ketones, polyethers, esters, carboxylic acids, polycarboxylic acids, celluloses, saccharides, sulfonic acids, amino acids, and amines, and more specifically, aliphatic alcohols such as methanol, ethanol, propanol, butanol, pentanol, and hexanol; aliphatic polyhydric alcohols such as ethylene glycol, propanediol, butanediol, glycerine, polyethylene glycol, and polypropylene glycol; aromatic alcohols such as phenol, catechol, and cresol; alcohols having a heterocycle such as furfuryl alcohol; ketones such as acetone, methyl ethyl ketone, and acetylacetone; ethers or polyethers such as ethyl ether, tetrahydrofuran, dioxane, polyoxyalkylene ether, ethylene oxide adduct, and propylene oxide adduct; esters such as ethyl acetate, ethyl acetoacetate, and glycine ethyl ester; carboxylic acids, polycarboxylic acids, or hydroxycarboxylic acids, such as formic acid, acetic acid, propionic acid, butanoic acid, butyric acid, oxalic acid, malonic acid, citric acid, tartaric acid, gluconic acid, salicylic acid, benzoic acid, acrylic acid, maleic acid, glyceric acid, eleostearic acid, polyacrylic acid, polymaleic acid, and acrylic acid-maleic acid copolymer, and salts thereof; carboxymethylcelluloses; monosaccharides such as glucose and galactose; polysaccharides such as sucrose, lactose, amylose, chitin, and cellulose; sulfonic acids such as alkylbenzenesulfonic acid, para-toluenesulfonic acid, alkylsulfonic acid, α-olefinsulfonic acid, polyoxyethylenealkylsulfonic acid, ligninsulfonic acid, and naphthalenesulfonic acid, and salts thereof; amino acids such as glycine, glutamic acid, aspartic acid, and alanine; hydroxyamines such as monoethanolamine, diethanolamine, triethanolamine, and butanolamine; trimethyl aminoethyl alkylamide; alkylpyridinium sulfuric acid salts; alkyltrimethylammonium halides; alkylbetaines; alkyl diethylene triamino acetic acids; and the like. Among these water-soluble organic materials, those that have at least one functional group from a hydroxyl group, a carboxyl group, and an amino group are preferable, and hydroxycarboxylic acids having a hydroxyl group and a carboxyl group and salts thereof are particularly preferable, with examples being sodium gluconate, tartaric acid, and the like. It is preferable that the water-soluble organic material is concomitantly present in a range of about 0.001 wt % to about 10 wt % in an aqueous ammonia-added raw material solution, which will be described below. A preferable sulfate ion source is zinc sulfate as stated above. The raw material solution may further comprise the above-described additive substance such as a dopant.

At this time, the raw material solution is preferably heated to a preliminary reaction temperature of 70 to 100° C. and more preferably 80 to 100° C. After or during this heating, aqueous ammonia is preferably added to the raw material solution, and the raw material solution to which aqueous ammonia has been added is preferably kept at a temperature of 70 to 100° C. for 0.5 to 10 hours and more preferably at a temperature of 80 to 100° C. for 2 to 8 hours.

Next, the plate-like precursor particles are calcined by increasing the temperature to a calcination temperature at a rate of 150° C./h or lower to produce a zinc oxide powder composed of a plurality of plate-like zinc oxide particles. It is considered that by lowering the rate of temperature increase to 150° C./h or lower, the crystal plane of the precursor material is easily inherited by zinc oxide when the precursor material changes into zinc oxide, thus resulting in an enhanced degree of orientation of plate-like particles in a green body. Also, it is considered that the connectivity of primary particles to each other is enhanced, and plate-like particles are thus unlikely to collapse. A preferable rate of temperature increase is 120° C./h or lower, more preferably 100° C./h or lower, even more preferably 50° C./h or lower, particularly preferably 30° C./h or lower, and most preferably 15° C./h or lower. The zinc oxide precursor particles are preferably washed, filtered, and dried before calcination. The calcination temperature is not particularly limited as long as the precursor compound such as zinc hydroxide can change into zinc oxide, and the calcination temperature is preferably 800 to 1100° C. and more preferably 850 to 1000° C. The plate-like precursor particles are retained at such a calcination temperature preferably for 0 to 3 hours and more preferably for 0 to 1 hour. Such temperature retaining conditions enable the precursor compound such as zinc hydroxide to change more reliably into zinc oxide. Due to such a calcination step, the plate-like precursor particles change into plate-like zinc oxide particles that have many pores.

The zinc oxide powder can be mixed with an additive substance. Such additive substances may be, as secondary components, various additive agents or dopants as described above, which impart properties (such as electroconductive or insulative properties) desired depending on the use or the specification of a green body. Preferable examples of dopant elements include B, Al, Ga, In, C, F, Cl, Br, I, H, Li, Na, K, N, P, As, Cu, Ag, Zr, and any combinations of these, and more preferable are Al and/or Ga that leads to the formation of spinel phases ($ZnAl_2O_4$ and/or $ZnGa_2O_4$). These dopant elements may be added in the form of compounds containing these elements (e.g., alumina) or in the form of ions to the zinc oxide powder. A method for adding the additive substance is not particularly limited, but in order to allow the additive substance to reach the interior of the fine pores of the zinc oxide powder, preferable examples thereof include (1) a method in which the additive substance is added in the form of a fine powder such as nanoparticles to the zinc oxide powder; (2) a method in which the additive substance is dissolved or dispersed in a solvent and then added to the zinc oxide powder followed by drying this solution; and so on. After the addition of an additive substance, it is preferable to perform treatment for uniform dispersion using a known means such as an ultrasonic homogenizer.

(2) Preparation of Zinc Oxide-Based Sintered Body

Using the above zinc oxide powder, a highly oriented zinc oxide green body and zinc oxide-based sintered body can be prepared. That is, since this zinc oxide powder is composed of plate-like particles, a green body with oriented plate-like particles can be obtained by preparing a green body using a shaping method such as tape casting or extrusion molding in which shearing force is applied to the plate-like particles. Also, sintering such a highly oriented green body makes it possible to obtain a highly oriented sintered body. In addition, since an additive substance can be uniformly dispersed in this zinc oxide green body and zinc oxide-based sintered body, it is possible to exert to the maximum extent the desired properties that are to be imparted by the additive substance. In the case where the zinc oxide powder does not contain the above-described additive substance, the additive substance may be added when preparing a green body, and addition of the additive substance can be also performed as described above. In this case as well, after the addition of an additive substance, it is preferable to perform treatment for uniform dispersion using a known means such as an ultrasonic homogenizer, as described above.

The zinc oxide powder is oriented by a technique using shearing force to provide an oriented green body. Preferable examples of techniques using shearing force include tape casting, extrusion molding, a doctor blade method, and any combination of these. Regarding the orientation techniques using shearing force, in any of the techniques exemplified above as well, it is preferable that additives such as a binder, a plasticizer, a dispersant, and a dispersion medium are suitably added to the plate-like zinc oxide powder to form a slurry, and this slurry is passed through a slit-like narrow discharge port to discharge and shape the slurry into a sheet form on a substrate. The slit width of the discharge port is preferably 10 to 400 µm. The amount of dispersion medium is preferably such an amount that the slurry viscosity is 4000 to 100000 cP and more preferably 5000 to 60000 cP. The thickness of the oriented green body shaped into a sheet form is preferably 5 to 500 µm and more preferably 10 to 200 µm. It is preferable that multiple pieces of this oriented green body that has been shaped into a sheet form are stacked to form a precursor laminate having a desired thickness, and this precursor laminate is subjected to pressing. This pressing can be preferably performed by packaging the precursor laminate in a vacuum pack or the like and subjecting it to isostatic pressing in hot water at a temperature of 50 to 95° C. under a pressure of 10 to 2000 kgf/cm². When extrusion molding is used, a flow channel in a metal mold may be designed such that the slurry passes through a narrow discharge port inside the metal mold, then pieces of a green body in a sheet form are integrated into a single body in the metal mold, and the green body is discharged in a laminated state. It is preferable to degrease the resulting green body in accordance with known conditions.

The oriented green body obtained as described above is fired at a firing temperature of preferably 1320 to 1500° C. and more preferably 1350 to 1450° C. to form a zinc oxide-based sintered body comprising oriented plate-like zinc oxide particles. The firing time at the aforementioned firing temperature is not particularly limited, and is preferably 1 to 10 hours and more preferably 2 to 5 hours. The zinc oxide-based sintered body obtained in this way has a high degree of (002) orientation at the plate surface, and the degree of orientation is preferably 80% or greater, more preferably 85% or greater, and even more preferably 90% or greater.

EXAMPLES

The present invention will now be more specifically described by way of the following examples.

Example 1

(1) Preparation of Plate-Like Zinc Oxide Powder 1730 g of zinc sulfate heptahydrate (manufactured by Kojundo Chemical Laboratory Co., Ltd.) and 4.5 g of sodium gluconate (manufactured by Wako Pure Chemical Industries, Ltd.) were dissolved in 3000 g of ion exchanged water. This solution was placed in a beaker and heated to 90° C. while being stirred with a magnetic stirrer, to complete dissolution. While this solution was kept at 90° C. and stirred, 490 g of 25% aqueous ammonia was added dropwise with a microtube pump. After the end of dropwise addition, the solution was kept at 90° C. for 4 hours while being stirred, and then left to stand still. The precipitates were separated by filtration, further, were washed with ion exchanged water 3 times, and were dried to give a zinc oxide precursor material in the form of a white powder. The resulting zinc oxide precursor material was placed on a zirconia plate and calcined in air in an electric furnace to give a plate-like porous zinc oxide powder. The temperature schedule during calcination was as follows: the temperature was increased at a rate of 20° C./h from room temperature to 900° C., then kept at 900° C. for 30 minutes, and cooled naturally.

(2) Preparation of Zinc Oxide Sintered Body 98 parts by weight of the resulting plate-like zinc oxide powder and 2 parts by weight of θ-alumina (a specific surface area of 85 m²/g, manufactured by Sumitomo Chemical Co., Ltd.) were ground and mixed using a ball mill. At this time, IPA (isopropyl alcohol) was used as a solvent, and θ-alumina was dispersed in IPA in advance using an ultrasonic homogenizer. The slurry after grinding and mixing was dried in a rotary evaporator to prepare a zinc oxide-alumina mixed powder. The resulting mixed powder had a volume-based average particle diameter (D50) of 0.6 µm. Subsequently, 100 parts by weight of the resulting mixed powder was mixed with 10 parts by weight of a binder (polyvinyl butyral: Part No. BM-2, manufactured by Sekisui Chemical Co., Ltd.), 4.0 parts by weight of a plasticizer (DOP: di(2-ethylhexyl)phthalate, manufactured by Kurogane Kasei Co., Ltd.), 2 parts by weight of a dispersant (trade name: Rheodol SP-030, manufactured by Kao Corporation), and a dispersion medium (2-ethylhexanol). The amount of the dispersion medium was adjusted such that the slurry viscosity was 5000 cP. The slurry thus prepared was applied onto a PET film by a doctor blade method to form a sheet having a thickness after drying of 20 µm. The resulting tape was cut, stacked, placed on an aluminum plate having a thickness of 10 mm, and then vacuum-packed. This vacuum pack was subjected to isostatic pressing in hot water at 85° C. under a pressure of 100 kgf/cm² to prepare a disc-like green body having a diameter of about 190 mm and a thickness of 6 mm. The resulting green body was placed in a degreasing furnace and degreased at 600° C. for 20 hours. The resulting degreased body was fired under atmospheric pressure at 1400° C. for 5 hours in nitrogen to give a disc-like zinc oxide-based sintered body as a sputtering target.

(3) Determination of Density

A test piece having 3 mm×4 mm×40 mm was cut out from the disc-like sintered body, the density was measured by the Archimedes method using water as a solvent, and thus the value shown in Table 1 was obtained.

(4) Determination of Degree of Orientation

The degree of (002) orientation was measured by XRD using the plate surface of the disc-like sintered body as a sample surface. This measurement was performed by measuring an XRD profile through irradiating the sample surface of the disc-like sintered body with X rays using an XRD apparatus (manufactured by Rigaku Corporation, trade name "RINT-TTR III"). The (002) orientation [%] was calculated according to the following formulae, and the value shown in Table 1 was obtained.

$$\text{Degree of (002) orientation [\%]} = \frac{p - p_0}{1 - p_0} \times 100 \quad \text{[Formula 2]}$$

$$p_0 = \frac{I_0(002)}{I_0(100) + I_0(002) + I_0(101)}$$

$$p = \frac{I_s(002)}{I_s(100) + I_s(002) + I_s(101)}$$

where $I_0(hkl)$ and $I_s(hkl)$ are diffraction intensities (integral values) of the (hkl) planes in ICDD No. 361451 and a sample, respectively (5) Evaluation of Spinel Phase The number of spinel phases per area [count/100 µm²] was measured by the following method. A test piece was cut out from the vicinity of the center of the disc-like sintered body, and a surface perpendicular to the disc surface was polished. Near the central part of the test piece in the thickness direction, a backscattered electron image was obtained over a scanning electron microscopic visual field of 20 µm×20 µm, and the number of phases having a contrast different from the ZnO matrix was counted in each of the four 10 µm×10 µm visual fields obtained by dividing the backscattered electron image into four equal parts in a lattice-like manner. Whether the phase differing in contrast from ZnO is a spinel phase or not was verified by a crystalline phase analysis by XRD and a compositional analysis by EDS. The average value of the four visual fields was regarded as the number of the spinel phases per area [count/100 µm²] in the sample. Moreover, the value obtained by dividing the standard deviation of the number of the spinel phases of the four visual fields by the aforementioned average value of the four visual fields was regarded as a spinel phase distribution index.

(6) Evaluation of Pores

The number of pores per area [count/mm²] was measured by the following method. A test piece was cut out from the vicinity of the center of the disc-like sintered body, and a surface perpendicular to the disc surface was polished. Near the central part of the test piece in the thickness direction, a secondary electron image was obtained over a scanning electron microscopic visual field of 200 µm×200 µm, and the number of pores was counted. The average value of five visual fields was multiplied by 25 to calculate the number of pores in [count/mm²] unit.

(7) Evaluation of Zinc Oxide-Based Sputtered Film

Another disc-like sintered body prepared under the same conditions as above was bonded to a copper backing plate with indium. Using this as a target, sputtering was performed with a DC magnetron sputtering apparatus in a pure Ar atmosphere under a pressure of 0.5 Pa at a power supply of 200 W. After pre-sputtering for 5 hours, a film was formed on an alkali-free glass (Corning Eagle XG) substrate having a substrate temperature of 200° C. by sputtering. The sputtering time was adjusted such that the film thickness was 200±10 nm. The resistivity and the transmittance in a near-infrared region of the resulting zinc oxide-based sputtered film were evaluated. The resistivity of the film was measured by a four-point probe method using a resistivity meter (manufactured by Mitsubishi Chemical Corporation, Loresta EP). The transmittance in a near-infrared region of the film was measured by determining the average transmittance at a wavelength of 1000 nm to 1300 nm using a UV-Vis-NIR spectrophotometer (manufactured by Shimadzu Corporation, SolidSpec-3700). At this time, the transmittance value of the glass substrate alone was regarded as 100% for standardization. The resistivity and the transmittance of the film are shown in Table 1 as relative values, with the value of Example 1 being 1.00.

Example 2

A disc-like zinc oxide-based sintered body was prepared and evaluated in the same manner as in Example 1 except that the viscosity of the slurry in tape casting was 15000 cps. Results were as shown in Table 1.

Example 3

A disc-like zinc oxide-based sintered body was prepared and evaluated in the same manner as in Example 1 except that γ-alumina (manufactured by Sumitomo Chemical Co., Ltd., a specific surface area of 130 m²/g) was used as an Al source. Results were as shown in Table 1.

Example 4

A disc-like zinc oxide-based sintered body was prepared and evaluated in the same manner as in Example 1 except that the particle diameter (D50) of the plate-like zinc oxide powder after being ground was 0.4 μm, and the firing temperature was 1380° C. Results were as shown in Table 1.

Example 5

A disc-like zinc oxide-based sintered body was prepared and evaluated in the same manner as in Example 1 except that 98.5 parts by weight of plate-like zinc oxide powder and 1.5 parts by weight of θ-alumina were used. Results were as shown in Table 1.

Example 6

A disc-like zinc oxide-based sintered body was prepared and evaluated in the same manner as in Example 4 except that γ-alumina (manufactured by Sumitomo Chemical Co., Ltd., a specific surface area of 130 m²/g) was used as an Al source and the viscosity of the slurry in tape casting was 20000 cps. Results were as shown in Table 1.

Example 7

Comparative

A disc-like zinc oxide-based sintered body was prepared and evaluated in the same manner as in Example 1 except that α-alumina (manufactured by Sumitomo Chemical Co., Ltd., a specific surface area of 4.5 m²/g) was used as an Al source, and the dispersion step by an ultrasonic homogenizer was omitted. Results were as shown in Table 1.

Example 8

Comparative

A disc-like zinc oxide-based sintered body was prepared and evaluated in the same manner as in Example 4 except that the viscosity of the slurry was 3500 cps. Results were as shown in Table 1.

Example 9

Comparative

A disc-like zinc oxide-based sintered body was prepared and evaluated in the same manner as in Example 4 except that the firing temperature was 1300° C. Results were as shown in Table 1.

TABLE 1

|  | Degree of (002) orientation | Density [g/cm³] | Number of spinel phases [count/100 μm²] | Spinel phase distribution index | Number of pores [count/mm²] | Relative value of film resistivity | Relative value of film transmittance |
| --- | --- | --- | --- | --- | --- | --- | --- |
| Ex. 1 | 84 | 5.56 | 25 | 0.26 | 1015 | 1.00 | 1.00 |
| Ex. 2 | 91 | 5.57 | 34 | 0.15 | 1265 | 0.88 | 1.02 |
| Ex. 3 | 83 | 5.58 | 67 | 0.12 | 1165 | 0.92 | 1.01 |
| Ex. 4 | 86 | 5.52 | 39 | 0.09 | 1785 | 0.90 | 1.02 |
| Ex. 5 | 86 | 5.58 | 35 | 0.16 | 1025 | 0.99 | 1.04 |
| Ex. 6 | 92 | 5.55 | 58 | 0.09 | 1825 | 0.85 | 1.03 |
| Ex. 7* | 82 | 5.52 | 13 | 0.42 | 1255 | 1.21 | 0.95 |
| Ex. 8* | 71 | 5.56 | 29 | 0.17 | 1175 | 1.25 | 0.94 |
| Ex. 9* | 86 | 5.40 | 38 | 0.10 | 3645 | 1.30 | 0.94 |

*indicates comparative examples.

From the results shown in Table 1, it can be understood that a zinc oxide-based sputtered film having higher transparency and electrical conductivity can be produced by sputtering with a zinc oxide-based sputtering target having a) a degree of (002) orientation of ZnO of 80% or greater at a sputtering surface, b) a density of the zinc oxide-based sintered body of 5.50 g/cm³ or greater, c) the number of the spinel phases per area of 20 counts/100 μmt or greater, and d) a spinel phase distribution index of 0.40 or less.

What is claimed is:
1. A zinc oxide-based sputtering target composed of a zinc oxide-based sintered body comprising zinc oxide crystal grains as a main phase and spinel phases as a dopant-containing grain boundary phase, wherein the zinc oxide-based sputtering target has:
   a degree of (002) orientation of ZnO of 80% or greater at a sputtering surface,
   a density of the zinc oxide-based sintered body of 5.50 g/cm³ or greater,
   the number of the spinel phases per area of 20 counts/100 μm² or greater, and
   a spinel phase distribution index of 0.40 or less.
2. The zinc oxide-based sputtering target according to claim 1, wherein the zinc oxide-based sintered body has pores, and the number of the pores per area is 1500/mm² or greater.

3. The zinc oxide-based sputtering target according to claim 1, wherein the degree of (002) orientation of ZnO is 90% or greater at the sputtering surface.

4. The zinc oxide-based sputtering target according to claim 1, wherein the number of the spinel phases per area is 50 counts/100 $\mu m^2$ or greater.

5. The zinc oxide-based sputtering target according to claim 1, wherein the spinel phase distribution index is 0.20 or less.

6. The zinc oxide-based sputtering target according to claim 1, wherein the spinel phases are composed of $ZnAl_2O_4$ and/or $ZnGa_2O_4$.

* * * * *